(12) United States Patent
Lin et al.

(10) Patent No.: US 9,318,555 B2
(45) Date of Patent: Apr. 19, 2016

(54) FABRICATION OF GRAPHENE NANOELECTRONIC DEVICES ON SOI STRUCTURES

(75) Inventors: Yu-Ming Lin, Yorktown Heights, NY (US); Jeng-Bang Yau, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/611,923

(22) Filed: Sep. 12, 2012

(65) Prior Publication Data

US 2013/0001518 A1    Jan. 3, 2013

Related U.S. Application Data

(62) Division of application No. 12/620,320, filed on Nov. 17, 2009, now Pat. No. 8,673,703.

(51) Int. Cl.
*H01L 29/16* (2006.01)
*H01L 29/66* (2006.01)
(Continued)

(52) U.S. Cl.
CPC ...... *H01L 29/1606* (2013.01); *H01L 29/66742* (2013.01); *H01L 29/7781* (2013.01); *H01L 29/78687* (2013.01)

(58) Field of Classification Search
CPC ............ H01L 29/1606; H01L 29/7781; H01L 29/78684; H01L 29/78687
USPC ........................ 977/755, 758; 257/24, 29, 347
See application file for complete search history.

(56) References Cited

U.S. PATENT DOCUMENTS

| | | | |
|---|---|---|---|
| 6,383,904 B1 * | 5/2002 | Yu | ................................. 438/589 |
| 6,534,380 B1 | 3/2003 | Yamauchi et al. | |
| 6,846,718 B1 | 1/2005 | Aga et al. | |

(Continued)

FOREIGN PATENT DOCUMENTS

JP    2009-164432    7/2009

OTHER PUBLICATIONS

Reina et al., "Transferring and Identification of Single- and Few-Layer Graphene on Arbitrary Substrates", Journal of Physical Chemistry Letters C, © 2008, vol. 112, pp. 17741-17744.*

(Continued)

*Primary Examiner* — Stephen W Smoot
*Assistant Examiner* — Sun M Kim
(74) *Attorney, Agent, or Firm* — Scully Scott Murphy and Presser

(57) ABSTRACT

A semiconductor-on-insulator structure and a method of forming the silicon-on-insulator structure including an integrated graphene layer are disclosed. In an embodiment, the method comprises processing a silicon material to form a buried oxide layer within the silicon material, a silicon substrate below the buried oxide, and a silicon-on-insulator layer on the buried oxide. A graphene layer is transferred onto the silicon-on-insulator layer. Source and drain regions are formed in the silicon-on-insulator layer, and a gate is formed above the graphene. In one embodiment, the processing includes growing a respective oxide layer on each of first and second silicon sections, and joining these silicon sections together via the oxide layers to form the silicon material. The processing, in an embodiment, further includes removing a portion of the first silicon section, leaving a residual silicon layer on the bonded oxide, and the graphene layer is positioned on this residual silicon layer.

13 Claims, 11 Drawing Sheets

(51) Int. Cl.
*H01L 29/778* (2006.01)
*H01L 29/786* (2006.01)

(56) References Cited

U.S. PATENT DOCUMENTS

| | | | |
|---|---|---|---|
| 7,732,859 B2 | 6/2010 | Anderson et al. | |
| 7,858,989 B2 * | 12/2010 | Chen et al. | 257/76 |
| 2005/0051805 A1 | 3/2005 | Kim et al. | |
| 2006/0001111 A1 * | 1/2006 | Tsuchiya et al. | 257/410 |
| 2006/0094182 A1 * | 5/2006 | Hanafi et al. | 438/199 |
| 2008/0191196 A1 | 8/2008 | Lu et al. | |
| 2008/0261372 A1 | 10/2008 | Jafri et al. | |
| 2008/0272361 A1 | 11/2008 | Lim | |
| 2009/0020764 A1 * | 1/2009 | Anderson et al. | 257/77 |
| 2009/0039461 A1 | 2/2009 | Henson et al. | |
| 2009/0181502 A1 | 7/2009 | Parikh et al. | |
| 2009/0200707 A1 | 8/2009 | Kivioja et al. | |
| 2010/0006823 A1 * | 1/2010 | Anderson et al. | 257/24 |
| 2010/0025660 A1 | 2/2010 | Jain et al. | |

OTHER PUBLICATIONS

Lemme, et al., "Mobility in Graphene Double Gate Field Effect Transistors", Advanced Microelectronic Center Aachen (AMICA), Otto-Blumenthal-Str. 25, 52074 Aachen, Germany.

Ishigami, et al., "Atomic Structure of Graphene on SiO2", Nano Letters, 2007, vol. 7, No. 6, pp. 1643-1648.

Office Action dated Apr. 12, 2013 received in a related U.S. Patent Application, namely U.S. Appl. No. 12/620,320.

Notice of Allowance dated Oct. 29, 2013 received in U.S. Appl. No. 12/620,320.

* cited by examiner

FABRICATION OF GRAPHENE NANOELECTRONIC DEVICES ON SOI STRUCTURES

CROSS REFERENCE TO RELATED APPLICATION

This application is a divisional application of copending U.S. patent application Ser. No. 12/620,320, filed Nov. 17, 2009, the entire content and disclosure of which is hereby incorporated herein by reference.

BACKGROUND OF THE INVENTION

1. Field of the Invention

This invention generally relates to semiconductor-on-insulator structures, and more specifically, to silicon-on-insulator structures having graphene nanoelectronic devices.

2. Background Art

Semiconductor-on-insulator (SOI) technology is becoming increasingly important in semiconductor processing. An SOI substrate structure typically contains a buried insulator layer, which functions to electrically isolate a top semiconductor device layer from a base semiconductor substrate. Active devices, such as transistors, are typically formed in the top semiconductor device layer of the SOI substrate. Devices formed using SOI technology (i.e., SOI devices) offer many advantages over their bulk counterparts, including, but not limited to: reduction of junction leakage, reduction of junction capacitance, reduction of short channel effects, better device performance, higher packing density, and lower voltage requirements.

Recently, attention has been directed to using graphene with SOI structures. Graphene has emerged as a nanomaterial with intriguing physics and potential applications in electronic devices. It is believed that graphene provides the potential to achieve higher device densities, smaller feature sizes, smaller separation between features, and more precise feature shapes. In addition, the fabrication of graphene-based electronic devices is compatible with the current CMOS technology given its planar structures. Most graphene devices considered and studied so for are fabricated on an oxide substrate, which makes it difficult to integrate with other circuit components. So far, the integration of graphene devices and silicon devices has not been realized.

BRIEF SUMMARY

Embodiments of the invention provide a semiconductor-on-insulator structure having an integrated graphene layer, and a method of forming the semiconductor-on-insulator structure. In an embodiment, the method comprises processing a silicon material to form a buried oxide layer within the silicon material, a silicon substrate below the buried oxide layer, and a semiconductor-on-insulator layer on the buried oxide layer. A graphene layer is transferred onto said semiconductor-on-insulator layer, source and drain regions are formed in the semiconductor-on-insulator layer, and a top gate is formed above the graphene layer.

In one embodiment, the processing includes growing a respective oxide layer on each of first and second silicon sections, implanting hydrogen through the oxide layer grown on the first silicon section, and joining said first and second silicon sections together via said oxide layers to form the silicon material. The processing, in an embodiment, further includes removing a portion of the first silicon section, leaving a wafer structure comprised of said second silicon section, the buried oxide layer, and a silicon layer on the bonded oxide. The graphene layer is positioned on this silicon layer.

Embodiments of the invention provide a method to fabricate graphene devices and/or test structures by using an SOI wafer with built-in contact areas. Instead of using metals, highly doped SOI is used to make contact to graphene channel. This metal-less contact scheme eliminates the thermal budget limitations associated with metal contacts. Undoped SOI is used in embodiments of the invention to provide the ideal platform for graphene and Si hybrid circuits. Since the oxide substrate is found to cause significant noise and mobility degradation in most of the graphene devices studied so far, SOI may provide a better substrate to achieve low-noise, high performance graphene devices.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with a wide range of specific details. In other instances, well-known structures or processing steps have not been described in detail in order to avoid obscuring the invention.

Figure 1:
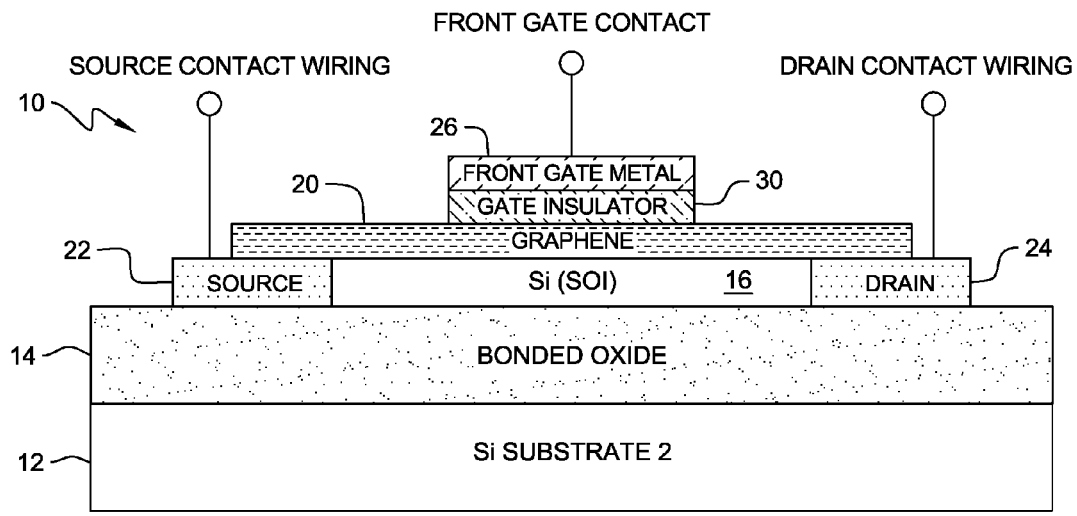
FIG. 1 shows an SOI structure according to embodiments of the present invention.

FIG. 1 shows a cross-sectional view of an example graphene electronic device fabricated on a silicon-on-insulator (SOI) structure according to one embodiment of the present invention. Structure 10 comprises a base semiconductor substrate 12, an insulator layer 14, a semiconductor layer 16, graphene layer 20, source region 22, drain region 24, front gate metal 26, and gate insulator 30.

The base semiconductor substrate layer 12 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it may be preferred that the base semiconductor substrate layer 12 be composed of a Si-containing semiconductor material, i.e., a semiconductor material that includes silicon. Further, the base semiconductor substrate layer 12 may be doped or contain both doped and undoped regions. Although the base semiconductor substrate layer 12 may be a bulk semiconductor structure, it may also include a layered structure with one or more buried insulator layers (not shown).

The buried insulator layer 14 may comprise any suitable insulator material(s), and it typically comprises an oxide, a nitride, or an oxynitride in either a crystalline phase or a non-crystalline phase. The buried insulator layer 14 may be a homogenous, continuous layer, or it may contain relatively large cavities or micro- or nano-sized pores (not shown). Physical thickness of the buried insulator layer 14 may vary widely depending on the specific applications, but it typically ranges from about 10 nm to about 500 nm, with from about 20 nm to about 300 nm being more typical.

The semiconductor device layer 16 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it may be preferred that the semiconductor device layer 16 be composed of a Si-containing semiconductor material, i.e., a semiconductor material that includes silicon. Further, the semiconductor device layer 16 may be doped or contain both doped and undoped regions therein. Physical thickness of the semiconductor device layer 16 may vary widely depending on the specific applications, but it typically ranges from about 10 nm to about 200 nm, with from about 20 nm to about 100 nm being more typical.

The gate electrode 26 is located above the semiconductor device layer 16, with graphene layer 20 and the gate insulator 30 located therebetween. The gate insulator may be, for example, an oxide layer deposited on a surface of the graphene layer; and the gate electrode is deposited on the gate insulator and is comprised of a conducting material such as a metal, metal alloy or polysilicon.

As one example, gate insulator layer 30 may comprise deposited silicon dioxide which is nitridized by plasma or thermal nitridation and having a thickness of about 1 nm or more. As a second example, layer 30 may be a high-K (dielectric constant from about 7 to about 30 or higher) material, examples of which include but are not limited to silicon nitride, metal silicates such as $HfSi_xO_y$, and $HfSi_xO_yN_z$, metal oxides such as $Al_2O_3$, $HfO_2$, $ZrO_2$, $Ta_2O_5$, and $BaTiO_3$, and combinations of layers thereof.

Gate electrode 26 is formed on a top surface of gate dielectric layer 30. Gate electrode 26 may, for example, be formed by deposition of a polysilicon layer, followed by photolithography or electron-beam lithography to define the gate shape and then an RIE process to remove excess polysilicon. Gate electrode 26 may be intrinsic (undoped) polysilicon or lightly-doped (not greater than about 1E15 atoms/cm$^3$ to about 1E16 atoms/cm.$^3$) P or N type.

Figure 2:
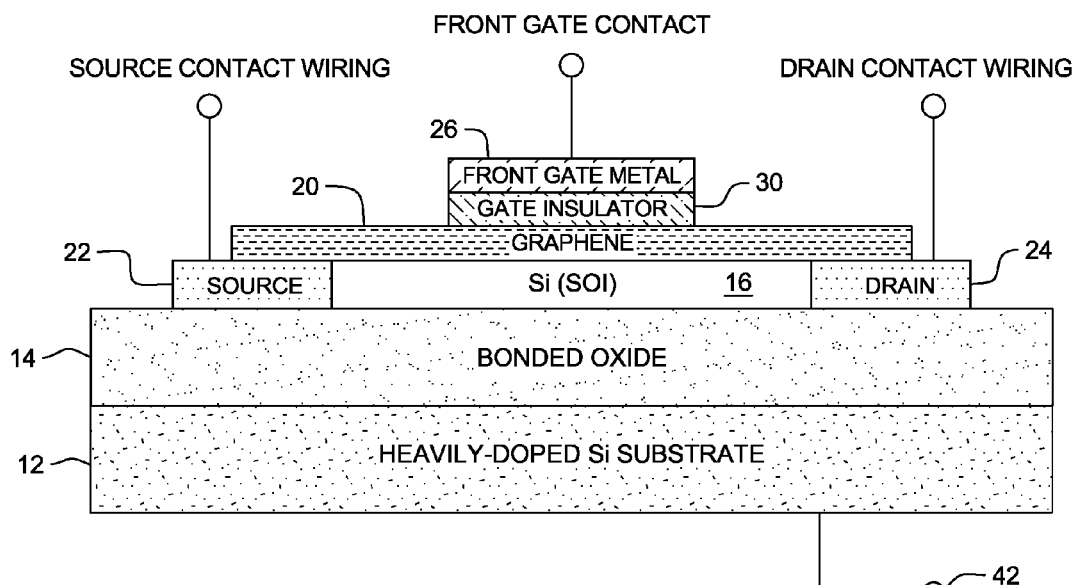
FIG. 2 depicts an SOI structure according to another embodiment of the invention.

FIG. 2 shows an alternate SOI structure 40 also comprising base semiconductor substrate 12, insulator layer 14, semiconductor layer 16, graphene layer 20, source region 22, drain region 24, front gate metal 26, and gate insulator 30. With the embodiment shown in FIG. 2, the substrate 12 is heavily doped, and includes or is connected to a backgate contact 42, and the substrate 12 can serve as a global backgate to tune the device performance.

Figure 12:
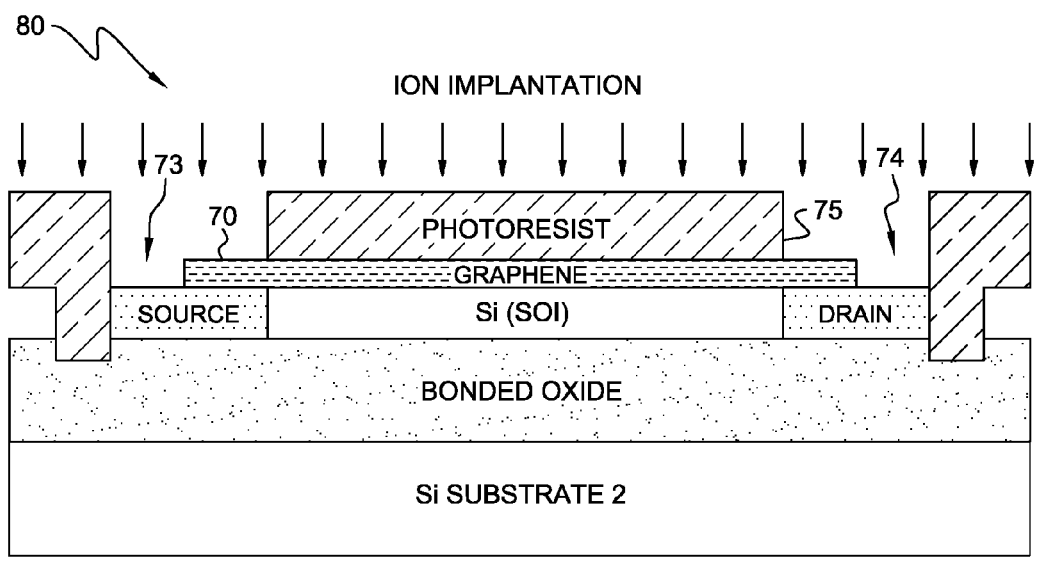
FIG. 12 depicts an ion implantation to dope the source/drain contact regions of the SOI structure.
Figure 13:
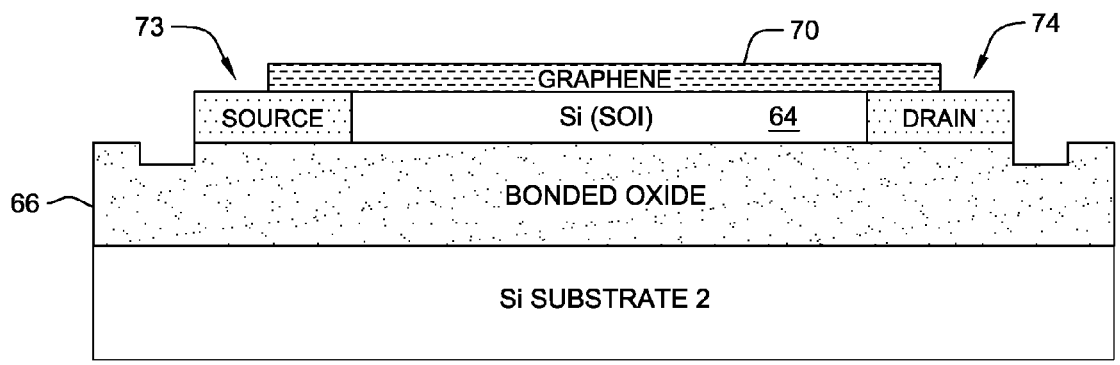
FIG. 13 illustrates a further annealing step to activate the implanted dopants.
Figure 14:
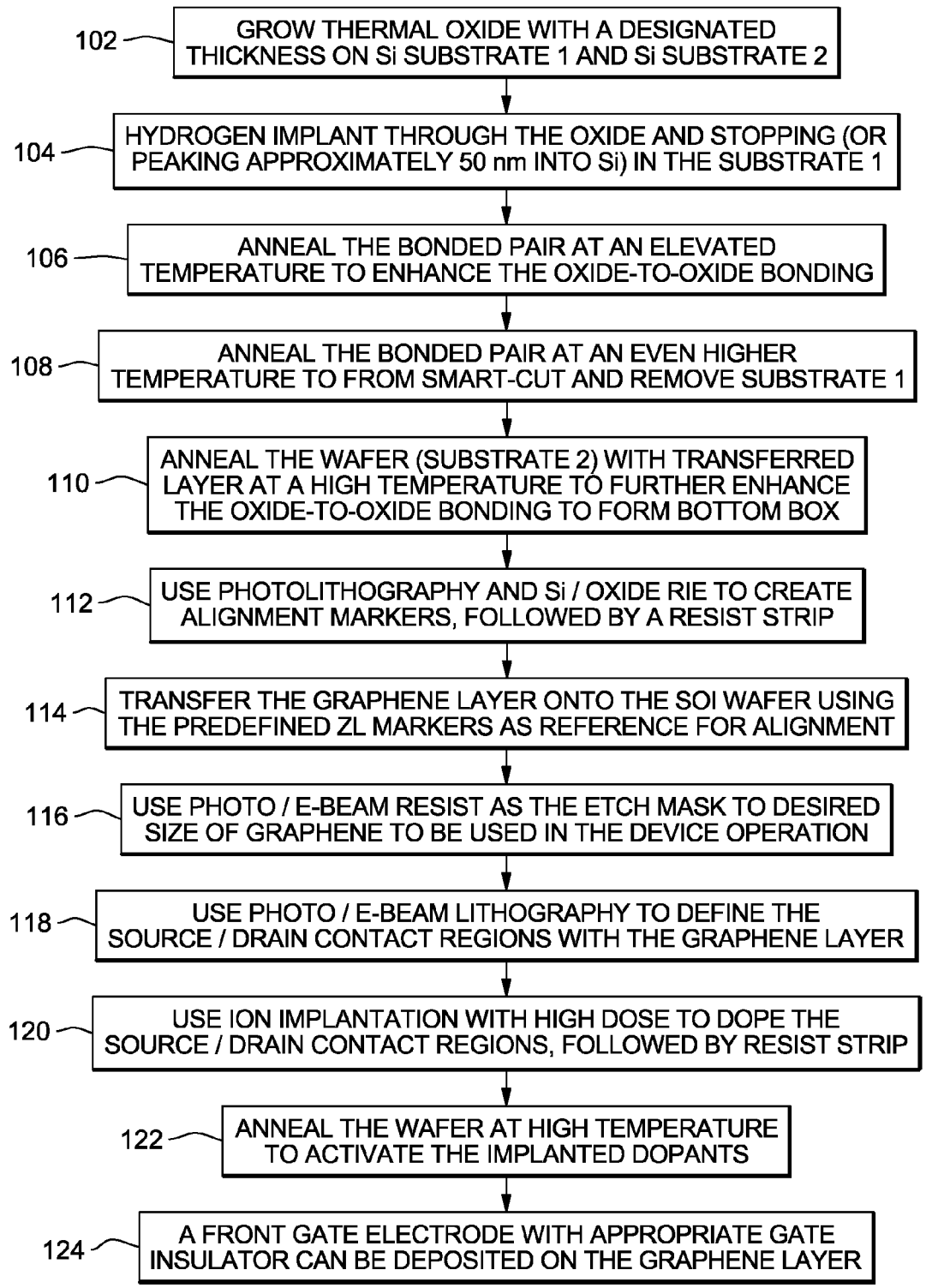
FIG. 14 shows a fabrication flow chart diagram according to an embodiment of the invention.

FIGS. 3-13 illustrate processing steps in the fabrication of the structures shown in FIGS. 1 and 2, and FIG. 14 shows a fabrication flow chart diagram according to an embodiment of the invention.

Figure 3:
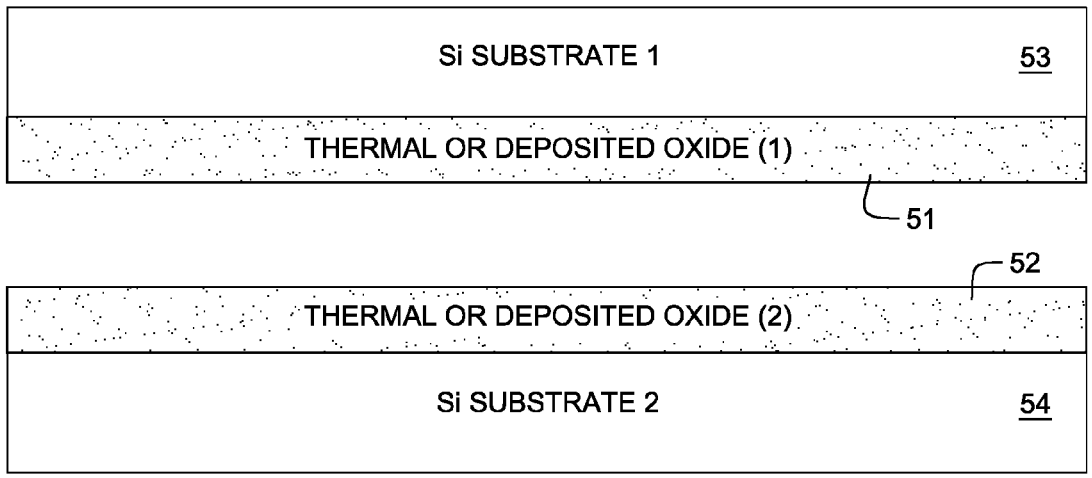
FIG. 3 illustrates a processing step for forming oxides on two silicon substrates to be bonded by joining the two oxide interfaces.

With reference to FIGS. 3 and 14, at step 102, an oxide layer 51, 52 is grown on each of two silicon substrates 53, 54, referred to, respectively, as Si substrate 1 and Si substrate 2. These oxide layers may be thermally grown or deposited with a designated thickness on the silicon substrates. Commercially available SOI wafers (120-145 nm BOX) can be used if graphene visibility on SOI is not an issue.

Figure 4:
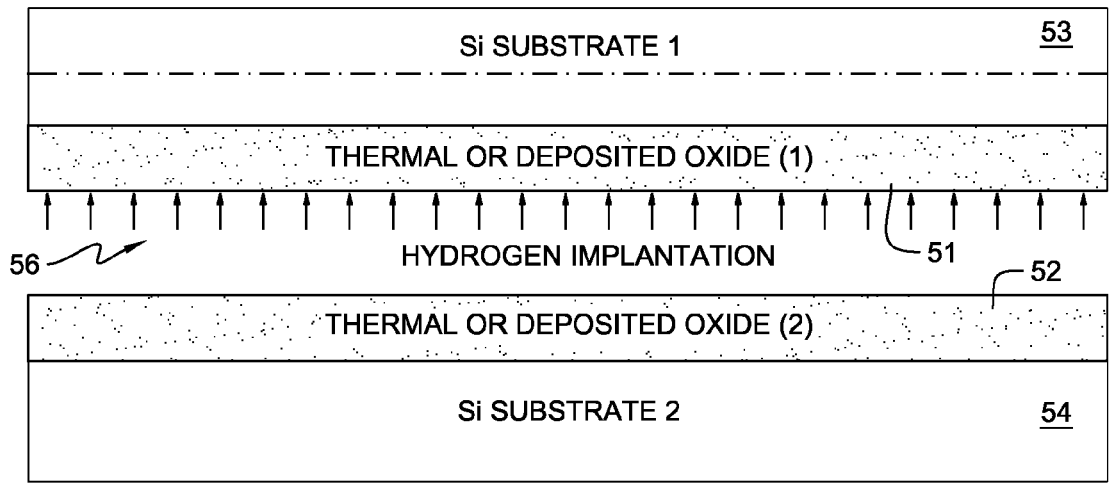
FIG. 4 depicts a hydrogen implantation through a thermal or deposited oxide.

A hydrogen implant, illustrated in FIG. 4 at 56, is performed at step 104. Hydrogen is implanted through the oxide and stopping (or peaking approximately 50 nm into the Si) in the Si substrate 1, in accordance with the well known Smart-Cut™ process described in U.S. Pat. No. 5,374,564. It may be noted that such bonded SOI can also be made with one bulk Si wafer and one SOI wafer, which will not require Smart-Cut™ and can still achieve comparable surface smoothness.

Figure 5:
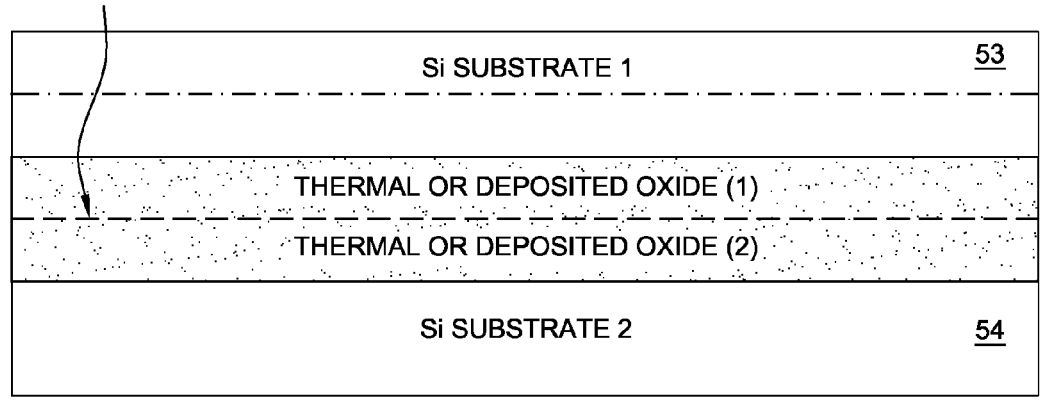
FIG. 5 shows an annealing step in an embodiment of the invention.
Figure 6:
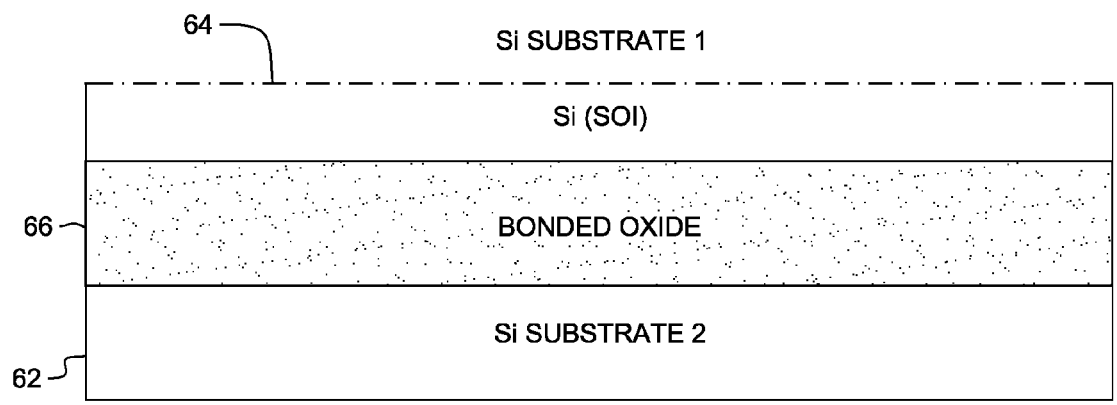
FIG. 6 illustrates a further annealing step.
Figure 7:
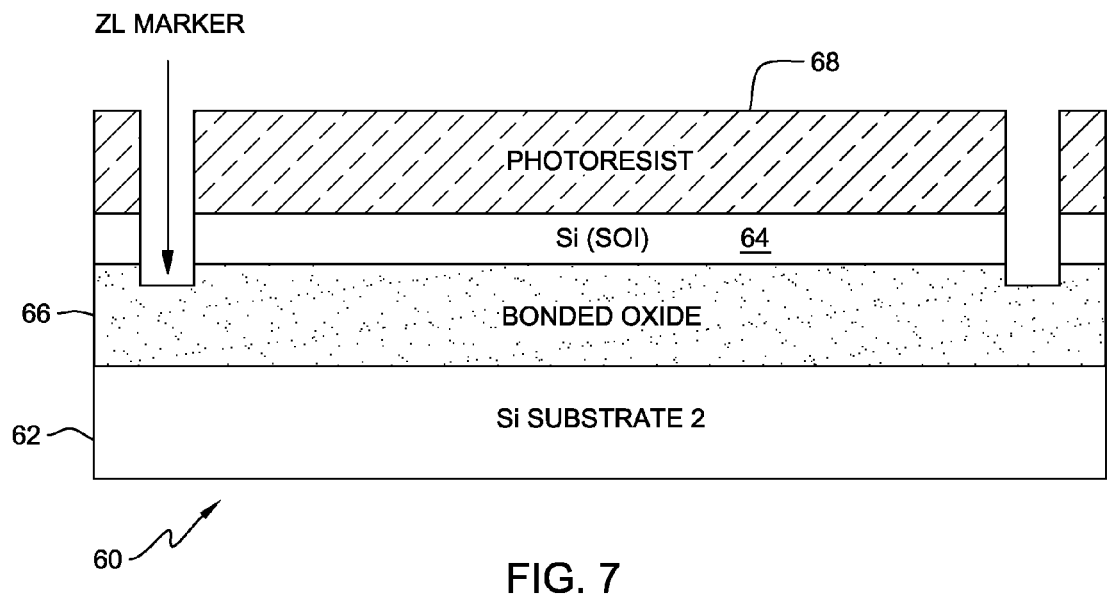
FIG. 7 shows a procedure for forming alignment markers in the SOI structure and the bonded oxide of FIG. 6.
Figure 8:
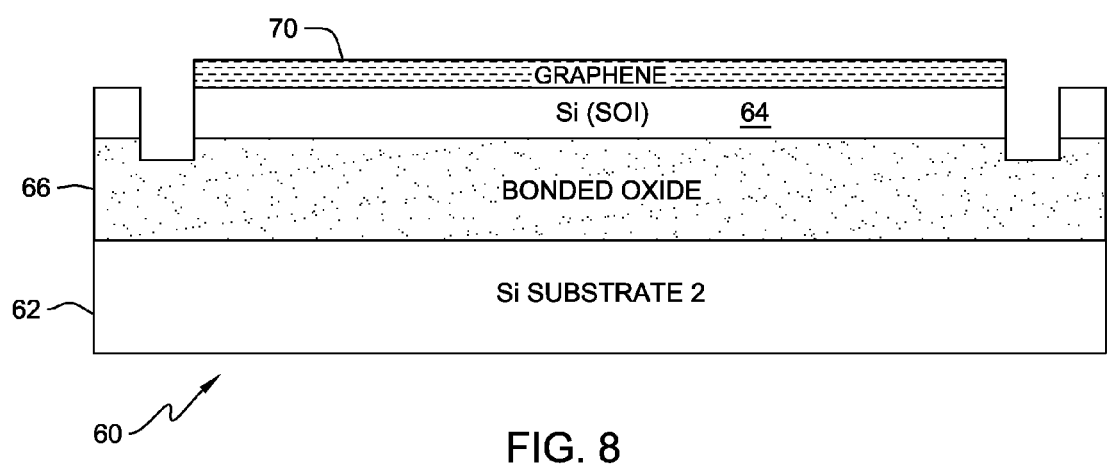
FIG. 8 illustrates the transfer of a graphene layer onto the SOI structure of FIG. 7.

The pair of substructures are then joined together; and at step 106, illustrated in FIG. 5, the bonded pair are annealed at an elevated temperature to enhance the oxide-to-oxide bonding. At step 108, depicted in FIG. 6, the bonded pair is annealed at an even higher temperature to form Smart-Cut© so as to create a front of connecting voids corresponding to allocation of the hydrogen species, and majority of Substrate 1 is removed as the bonded structure is separated along the void front. This leaves a silicon wafer structure, shown in FIG. 6 at 60, including Si substrate 62 and Si layer 64. Step 110 is to anneal the wafer 60 with transferred layer at a high temperature to further enhance the oxide-to-oxide bonding to form a bottom BOX 66. With reference to FIGS. 7 and 14, at step 112, photolithography and Si/oxide RIE may be used with a photoresist strip 68 to create alignment markers, referred to as ZL (Zero-level), followed by a resist strip. At step 114, illustrated in FIG. 8, the graphene layer 70 is transferred onto the SOI wafer 60 using the pre-defined ZL markers as reference for alignment.

Figure 9:
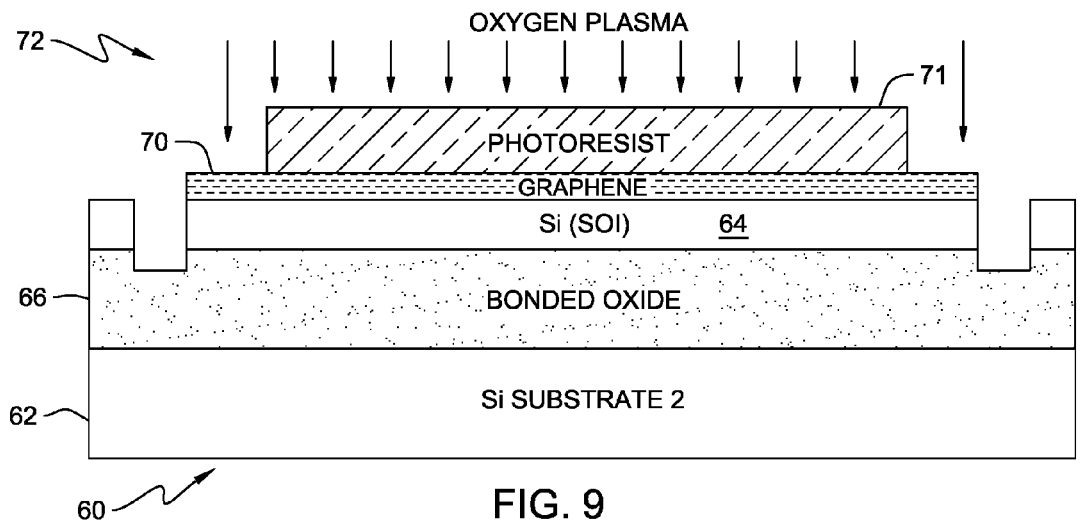
FIG. 9 depicts an etching step to define the desired size of the graphene layer.
Figure 10:
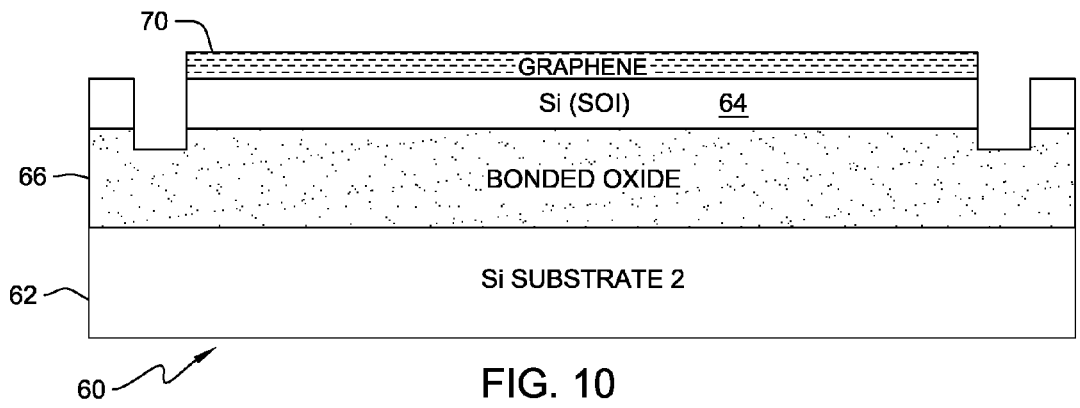
FIG. 10 shows the patterned graphene on SOI.

As shown in FIG. 9, at step 116, a photo/E-beam resist is used as the etch mask to define the desired size of the graphene to be used in the device operation. Oxygen plasma can be used to etch the graphene. More specifically, a photoresist 71 is applied onto the upper surface of the graphene layer 70; and, with the arrangement shown in FIG. 9, this photoresist covers a portion, but not all, of the graphene layer. An etching beam 72, which may be an oxygen plasma, is applied to the graphene and the photoresist, removing the portion of the graphene that is not covered by the photoresist. After this portion of the graphene layer has been removed, the photoresist is then removed, leaving the patterned graphene on SOI shown in FIG. 10.

Figure 11:
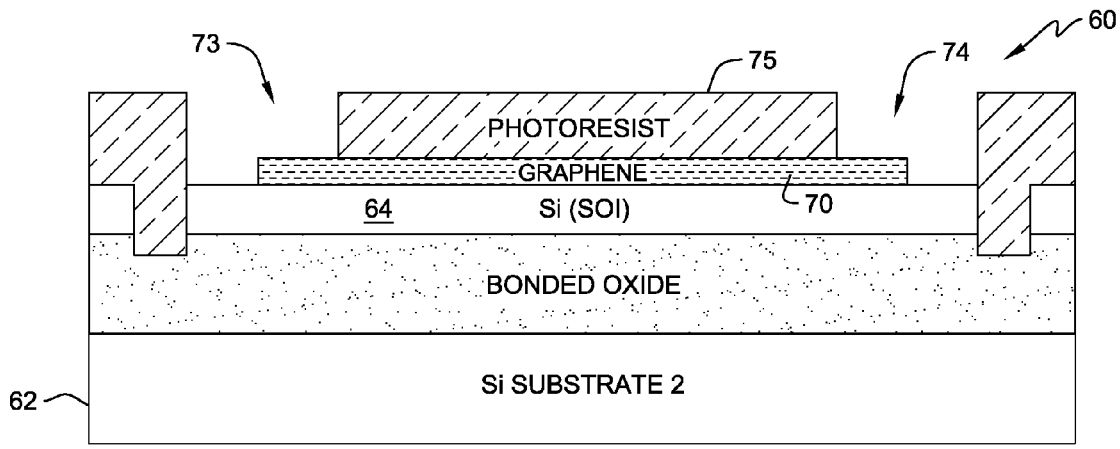
FIG. 11 illustrates a lithography step to define source/drain contact regions in the SOI structure of FIG. 10.

At step 118, and as illustrated in FIG. 11, photo/e-beam lithography is used to define the source/drain contact regions 73, 74 with the graphene layer. The lithography step includes applying a photoresist 75 onto the upper surface of the structure 60. The photoresist may be deposited and patterned on structure 60 using conventional photolithographic techniques that are well known by those of ordinary skill in the art. The pattern in the photoresist is then transformed to the underlying structure to define the source and drain contact regions with the graphene layer.

At step 120, illustrated in FIG. 12, ion implantation 80 is used with high dose (>$10^{20}$ cm$^{-3}$) to dope the source/drain contact regions 73, 74, followed by resist strip. In one embodiment of the present invention, the source/drain areas are formed by the ion implantation with ions comprising materials such as phosphorus, arsenic, or antimony. The photoresist 75 covering the graphene region 70 prevents implantation in that area. The doped semiconductor layer can also be formed by other doping techniques, such as solid-state diffusion from a doping layer, a vapor, or plasma-generated ions. FIG. 13 shows step 122, which is to anneal the wafer at high temperature (e.g., 950° C. in $N_2$) to activate the implanted dopants.

With reference again to FIG. 1, a front gate electrode 26 with appropriate gate insulator 30 can be deposited on the graphene layer, at step 124. As mentioned above, as one example, gate insulator layer 30 may comprise deposited silicon dioxide which can be, but not necessarily, nitridized by plasma or thermal nitridation and having a thickness of about 1 nm or more. As a second example, layer 30 may be a high-K (dielectric constant from about 7 to about 30 or higher) material, examples of which include but are not limited to silicon nitride, metal silicates such as $HfSi_xO_y$, and $HfSi_xO_yN_z$, metal oxides such as $Al_2O_3$, $HfO_2$, $ZrO_2$, $Ta_2O_5$, and $BaTiO_3$, and combinations of layers thereof.

Gate electrode 26 is formed on a top surface of gate insulator layer 30. Gate electrode 26 may, for example, be formed by deposition of a polysilicon layer, followed by photolithography or electron-beam lithography to define the gate shape and then an RIE process to remove excess polysilicon. Gate electrode 26 may be intrinsic (undoped) polysilicon or lightly-doped (not greater than about 1E15 atoms/cm$^3$ to about 1E16 atoms/cm$^3$) P or N type.

The structure of FIG. 2 can be fabricated by heavily doping the Si substrate and applying a backgate contact 42 to the substrate. This forms a backgate for device that can be used to tune the device performance.

Figure 15:
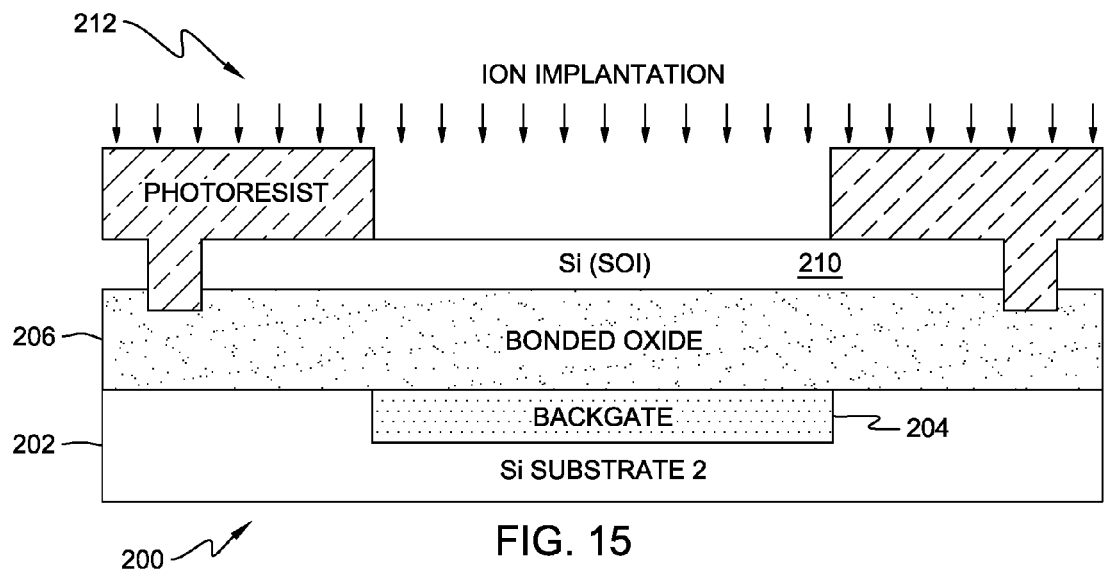
FIG. 15 shows a semiconductor structure that is doped with ion implantation in selective regions.

FIGS. 15-24 illustrate a further embodiment of the invention. In this embodiment, the Si substrate is doped with ion implantation in selective regions defined by photo/e-beam lithography. FIG. 15 shows a structure 200 similar to the structure of FIG. 8 but without the graphene layer 70 and with a backgate layer. In particular, structure 200 comprises Si substrate 202, backgate layer 204, bonded oxide (BOX) layer 206, and silicon-on-insulator layer 210. Photolithography and Si/oxide RIE is used to create alignment markers (ZL), followed by a resist strip. An ion implantation 212 is used to dope layer 202 with the ion species passing through the silicon-on-insulator layer and stopping within the Si substrate 202 underneath the bonded oxide layer 206 to form the backgate layer 204.

Figure 16:
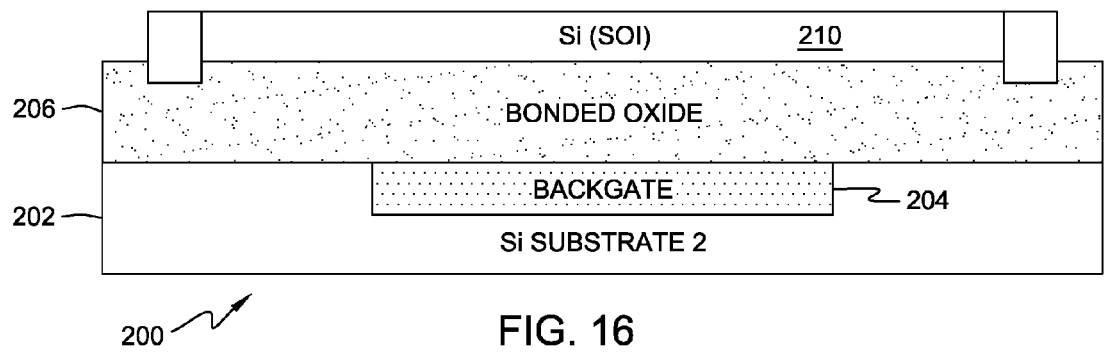
FIG. 16 illustrates the implanted wafer.
Figure 17:
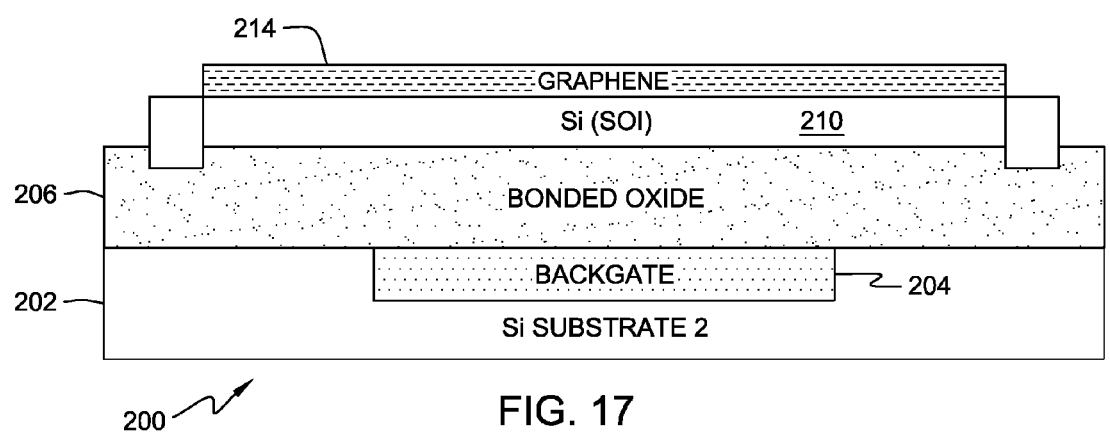
FIG. 17 shows a graphene layer deposited on the SOI wafer of FIG. 16.
Figure 18:
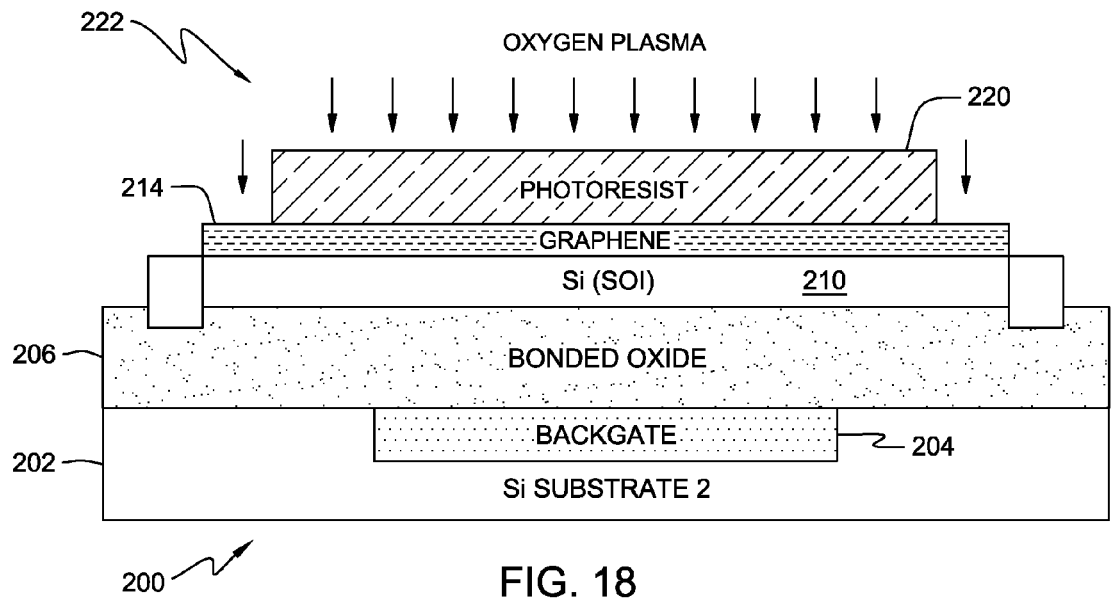
FIG. 18 depicts the use of an etching process to define the desired size of the graphene layer.
Figure 19:
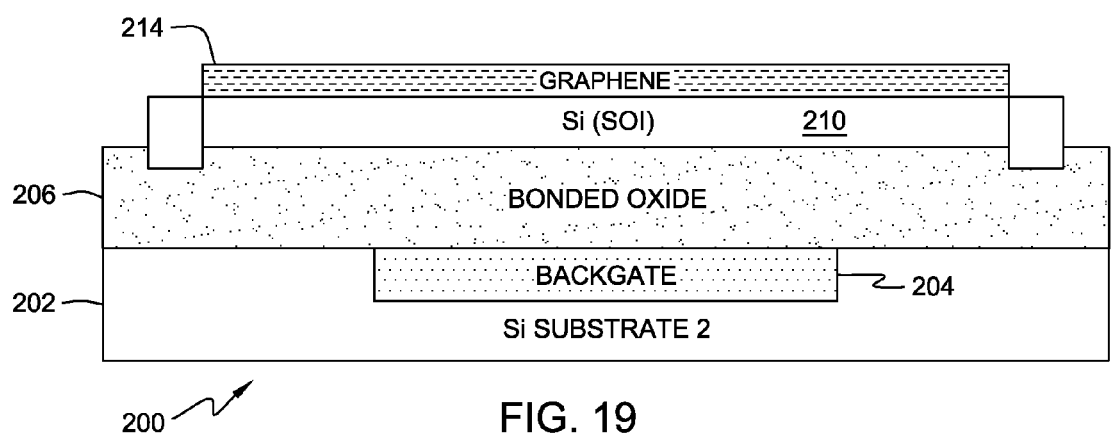
FIG. 19 shows the patterned graphene on backgated SOI after resist strip.

Then, with reference to FIG. 16, the implanted wafer is annealed at high temperature (e.g. 980° C.) to activate the dopants and to remove any defects created in the SOI and oxide by implantation. As illustrated in FIG. 17, a graphene layer 204 is deposited on the SOI wafer 200 using the predefined ZL markers as reference for alignment. As shown in FIG. 18, a photo/E-beam resist 220 is used as an etch mask to define the desired size of the graphene to be used in the device operation. For example, oxygen plasma 222 can be used to etch the graphene. FIG. 19 shows the patterned graphene 214 on the backgated SOI after the resist strip.

Figure 20:
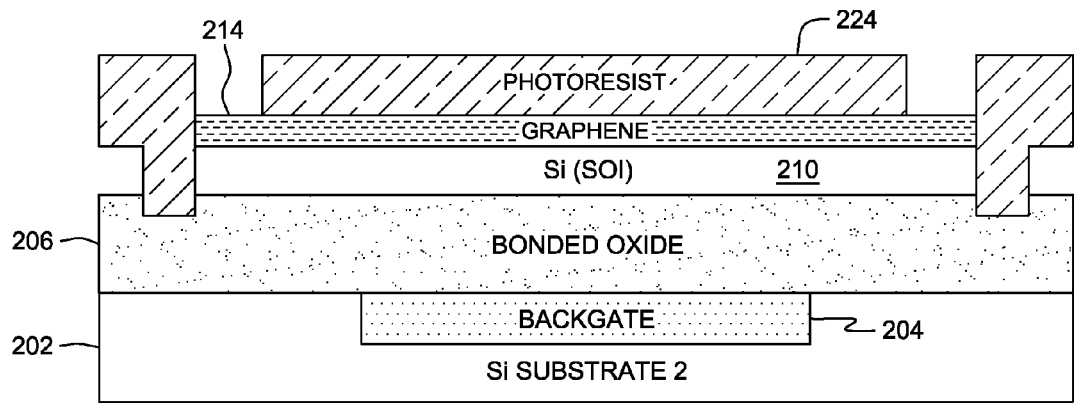
FIG. 20 illustrates photo-e-beam lithography to define source and drain contact regions in the SOI wafer.
Figure 21:
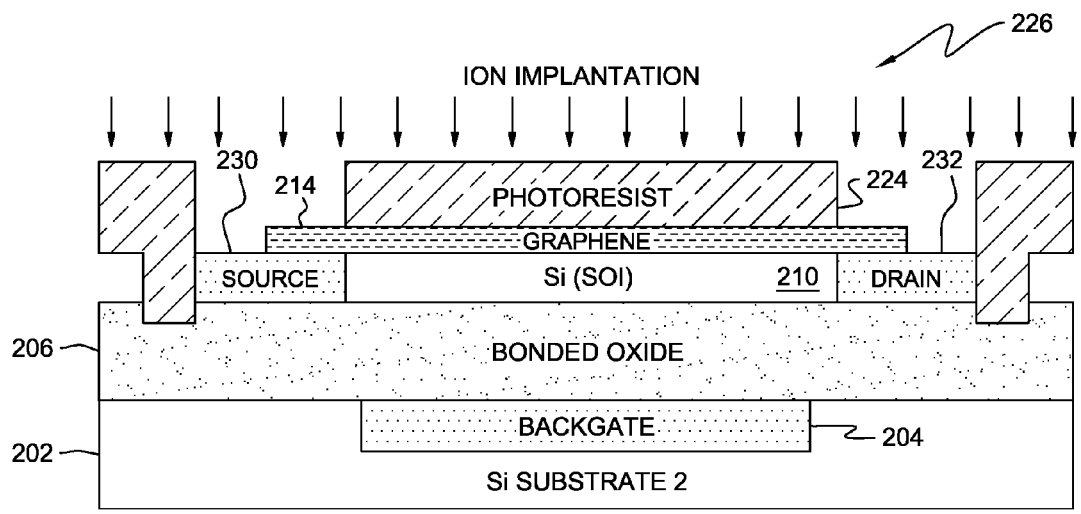
FIG. 21 shows an ion implantation to dope the source and drain contact regions.
Figure 22:
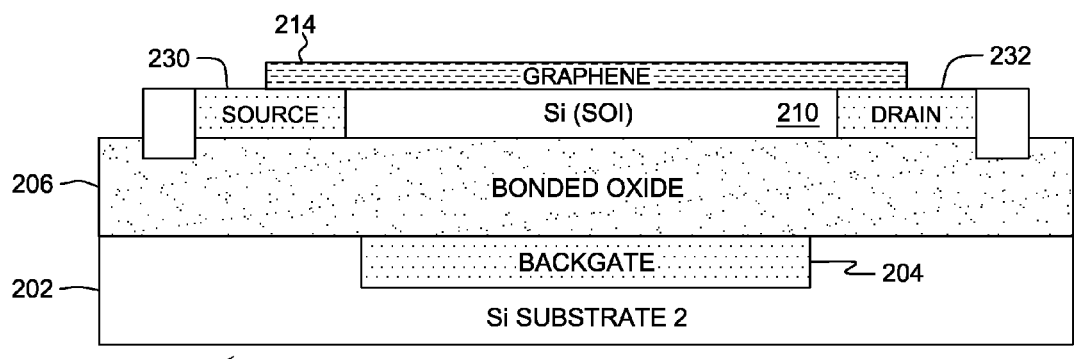
FIG. 22 represents an annealing step to activate the implanted dopants.

Photo/E-beam lithography is then used to define the source and drain contact regions where the graphene layer will be placed. More specifically, as shown in FIG. 20, a photoresist 224 is applied onto the upper surface of the graphene layer 214, and the photoresist covers a portion, but not all, of the graphene layer. As represented in FIG. 21, ion implantation 226 with high dose (>$10^{20}$ cm$^{-3}$) is used to dope the source and drain contact regions 230, 232, followed by a resist strip, resulting in the structure of FIG. 22. The wafer is then annealed at high temperature (e.g., 950° C. in $N_2$) to activate the implanted dopants.

Figure 23:
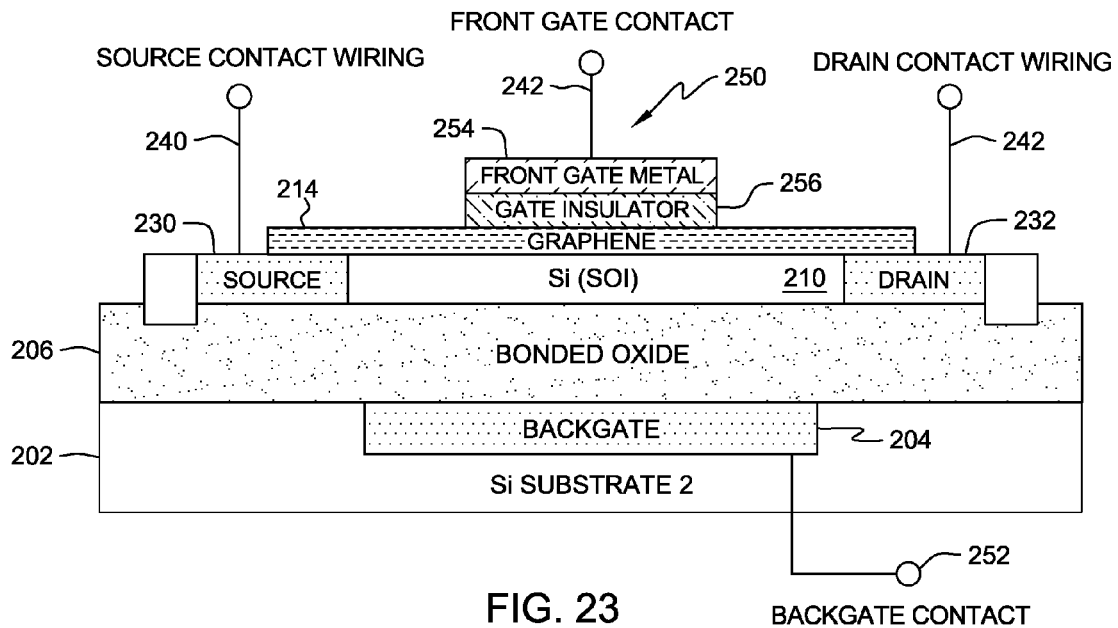
FIG. 23 shows a front gate electrode with a gate insulator deposited on the graphene layer.

As illustrated in FIG. 23, source contact wiring 240, front gate contact wiring 242, and drain contact wiring 244 are connected to source region 230, front gate 250, and drain region 232, respectively. A backgate contact 252 is connected to backgate 204. The front gate 250 is comprised of front gate metal 254 on a gate insulator 256. As one example, gate insulator layer 256 may comprise thermally grown or deposited silicon dioxide which can be, but not necessarily, nitridized by plasma or thermal nitridation and having a thickness of about 1 nm or more. As a second example, layer 256 may be a high-K (dielectric constant from about 7 to about 30 or higher) material, examples of which include but are not limited to silicon nitride, metal silicates such as $HfSi_xO_y$, and $HfSi_xO_yN_z$, metal oxides such as $Al_2O_3$, $HfO_2$, $ZrO_2$, $Ta_2O_5$, and $BaTiO_3$, and combinations of layers thereof.

Gate electrode 254 is formed on a top surface of gate insulator layer 256. Gate electrode 257 may, for example, be formed by deposition of a polysilicon layer, followed by photolithography or electron-beam lithography to define the gate shape, and then an RIE process to remove excess polysilicon. Gate electrode 252 may be intrinsic (undoped) polysilicon or lightly-doped (not greater than about 1E15 atoms/cm$^3$ to about 1E16 atoms/cm$^3$) P or N type.

Figure 24:
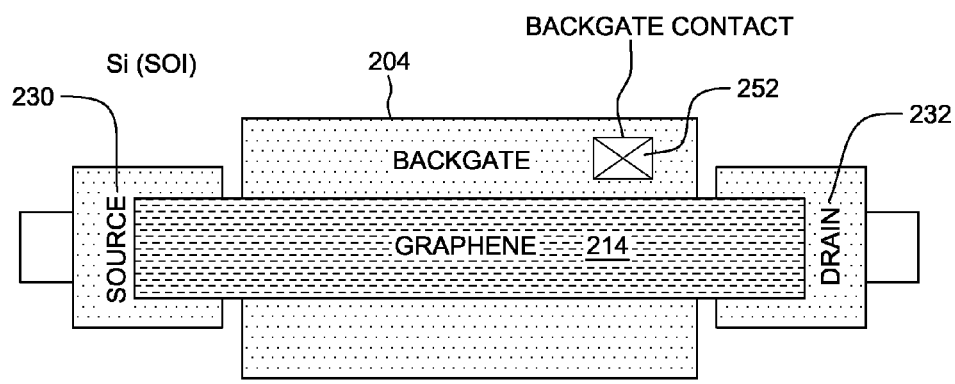
FIG. 24 is a top view showing the graphene layer, source and drain regions and backgate of the structure of FIG. 23.

FIG. 24 is a top view showing the graphene layer 214, source and drain regions 230, 232 and backgate 204.

While it is apparent that the invention herein disclosed is well calculated to fulfill the objects discussed above, it will be appreciated that numerous modifications and embodiments may be devised by those skilled in the art, and it is intended that the appended claims cover all such modifications and embodiments as fall within the true scope of the present invention.

What is claimed is:

1. A silicon-on-insulator structure having an integrated graphene layer, comprising:
   a silicon material comprising a buried oxide layer within the silicon material, a silicon substrate on a first side of the buried oxide layer, and a silicon-on-insulator layer on a second side of the buried oxide layer;
   first and second laterally spaced apart recesses in the silicon-on-insulator layer, wherein the first and second recesses extend through the silicon-on-insulator layer and into the buried oxide layer;
   a graphene layer positioned directly on the silicon-on-insulator layer in contact therewith and on a side thereof opposite to the buried oxide layer, the graphene layer being in metal-less contact with the silicon-on-insulator layer and being laterally between and spaced from the first and second recesses;

source and drain regions in the silicon-on-insulator layer in the spaces between the graphene layer and the first and second recesses;

a gate above the graphene layer; and a gate insulator positioned directly on the graphene layer, between the graphene layer and the gate; and wherein the graphene layer is above the bonded oxide layer and is directly above and in direct contact with the silicon-on-insulator layer, and opposite lateral ends of the graphene layer are in direct contact with, respectively, the source and drain regions and laterally inside of the first and second recesses; and wherein the silicon material further comprises a backgate layer comprised of a doping ion in the silicon substrate directly beneath and contiguous with a portion of the buried oxide layer.

2. The silicon-on-insulator structure according to claim 1, wherein the silicon-on-insulator layer has a planar surface, and the graphene layer is positioned on said planar surface.

3. The silicon-on-insulator structure according to claim 1, wherein the source and drain regions extend beneath and laterally extend outside of the graphene layer.

4. The silicon-on-insulator structure according to claim 1, wherein:
the backgate layer is laterally inside said first and second alignment markers.

5. The silicon-on-insulator structure according to claim 4, wherein the graphene layer laterally projects outside of the backgate layer.

6. The silicon-on-insulator structure according to claim 5, wherein the first and second recesses align the graphene layer on the silicon-on-insulator layer.

7. The silicon-on-insulator structure according to claim 1, wherein the first and second recesses extend downward, through the silicon-on-insulator layer, from a top surface thereof, and into the buried oxide layer.

8. The silicon-on-insulator structure according to claim 7, wherein:
the silicon-on-insulator layer includes outside sections laterally outside of the first and second recesses; and
the first and second recesses separate the source and drain regions from said outside sections of the silicon-on-insulator layer.

9. The silicon-on-insulator structure according to claim 8, wherein the silicon-on-insulator layer has a thickness between 20 nm and 100 nm.

10. A silicon-on-insulator structure having an integrated graphene layer, comprising:
a silicon material comprising a buried oxide layer formed within the silicon material, a silicon substrate on a bottom side of the buried oxide layer, a silicon-on-insulator layer on a top side of the buried oxide layer, and a backgate layer comprised of a doping ion species in the silicon substrate;

first and second laterally spaced apart recesses in the silicon-on-insulator layer, wherein the first and second recesses extend through the silicon-on-insulator layer and into the buried oxide layer;

a graphene layer positioned directly on a top side of the silicon-on-insulator layer in contact therewith, the graphene layer being in metal-less contact with the silicon-on-insulator layer and being laterally between and spaced from the first and second recesses;

source and drain regions in the silicon-on-insulator layer in the spaces between the graphene layer and the first and second recesses and extending beneath the graphene layer;

a gate above the graphene layer; and a gate insulator directly on the graphene layer, between said graphene layer and said gate; and wherein the graphene layer is above the bonded oxide layer and is directly above and in direct contact with the silicon-on-insulator layer, and opposite lateral ends of the graphene layer are in direct contact with, respectively, the source and drain regions and laterally inside of the first and second recesses.

11. The silicon-on-insulator structure according to claim 10, wherein:
the buried oxide layer has a specified thickness; and
the silicon-on-insulator layer has a planar surface, and the graphene layer is positioned on said planar surface.

12. The silicon-on-insulator structure according to claim 10, wherein the source and drain regions laterally extend outside of the graphene layer.

13. The silicon-on-insulator structure according to claim 12, wherein:
the backgate layer is laterally inside said first and second recesses; and
the first and second recesses align the graphene layer on the silicon-on-insulator layer.

* * * * *